US 6,732,003 B1

(12) United States Patent
Bolotin

(10) Patent No.: US 6,732,003 B1
(45) Date of Patent: May 4, 2004

(54) FEEDER/PROGRAMMING/LOADER SYSTEM

(75) Inventor: Lev M. Bolotin, Kirkland, WA (US)

(73) Assignee: Data I/O Corporation, Redmond, WA (US)

(*) Notice: Subject to any disclaimer, the term of this patent is extended or adjusted under 35 U.S.C. 154(b) by 467 days.

(21) Appl. No.: 09/632,895

(22) Filed: Aug. 7, 2000

(51) Int. Cl.⁷ .............................................. G06F 19/00
(52) U.S. Cl. ................................. 700/112; 414/749.1
(58) Field of Search .......................... 700/95, 112–114, 700/117–121, 228; 414/217, 217.1, 221, 222.01, 222.07–222.09, 222.13, 266, 273, 749.1

(56) References Cited

U.S. PATENT DOCUMENTS

| | | | | |
|---|---|---|---|---|
| 4,501,064 A | * | 2/1985 | DiNozzi et al. .............. 29/832 |
| 4,675,993 A | | 6/1987 | Harada ........................ 29/740 |
| 4,747,479 A | * | 5/1988 | Herrman .................. 198/345.2 |
| 4,917,556 A | * | 4/1990 | Stark et al. ................. 414/217 |
| 5,209,132 A | * | 5/1993 | Chayamichi et al. ....... 73/865.9 |
| 5,330,043 A | * | 7/1994 | Stuckey .................... 198/346.2 |
| 5,342,460 A | * | 8/1994 | Hidese ........................ 156/64 |
| 5,422,554 A | * | 6/1995 | Rohde .................... 318/568.21 |
| 5,536,128 A | * | 7/1996 | Shimoyashiro et al. ..... 414/273 |
| 5,544,411 A | * | 8/1996 | Kano et al. ................... 29/740 |
| 5,547,537 A | * | 8/1996 | Reynolds et al. ........... 156/351 |
| 5,692,292 A | * | 12/1997 | Asai et al. .................... 29/740 |
| 5,805,472 A | * | 9/1998 | Fukasawa ................... 702/118 |
| 5,820,679 A | * | 10/1998 | Yokoyama et al. ......... 118/719 |
| 5,870,820 A | * | 2/1999 | Arakawa et al. ............. 29/740 |
| 5,955,857 A | * | 9/1999 | Kwon et al. ........... 318/568.11 |
| 5,976,199 A | * | 11/1999 | Wu et al. ................... 29/25.01 |
| 6,024,526 A | * | 2/2000 | Slocum et al. ......... 414/226.01 |
| 6,055,632 A | | 4/2000 | Deegan et al. .............. 713/100 |
| 6,082,950 A | * | 7/2000 | Altwood et al. ............ 414/217 |
| 6,154,954 A | * | 12/2000 | Seto et al. .................... 29/740 |
| 6,169,935 B1 | * | 1/2001 | Iwasaki et al. ............. 700/214 |
| 6,229,323 B1 | * | 5/2001 | Tverdy et al. .............. 324/758 |
| 6,230,067 B1 | * | 5/2001 | White ........................ 700/112 |
| 6,241,459 B1 | * | 6/2001 | Canella et al. ........... 414/798.1 |
| 6,269,279 B1 | | 7/2001 | Todate et al. .............. 700/121 |
| 6,427,096 B1 | * | 7/2002 | Lewis et al. ................ 700/228 |
| 6,442,446 B1 | | 8/2002 | Nakamura et al. ......... 700/121 |
| 6,449,523 B1 | * | 9/2002 | Johnson et al. ............ 700/121 |
| 6,519,504 B1 | * | 2/2003 | Soraoka et al. ............ 700/228 |
| 6,535,780 B1 | | 3/2003 | Anderson et al. .......... 700/121 |
| 2002/0007227 A1 | | 1/2002 | Prentice et al. ............ 700/121 |

FOREIGN PATENT DOCUMENTS

| | | |
|---|---|---|
| EP | 1 093 332 A2 | 4/2001 |
| GB | 2318664 A | 4/1998 |

* cited by examiner

Primary Examiner—Maria N. Von Buhr
(74) Attorney, Agent, or Firm—Mikio Ishimaru

(57) ABSTRACT

A micro device product system is provided which includes a feeder/programming/loader system. The feeder/programming/loader system has a flexible feeder mechanism for receiving unprogrammed devices in a number of different manners, a programming mechanism for performing a programming operation on the unprogrammed devices at a high rate of speed, and a loader mechanism for receiving and storing the programmed devices for use in subsequent assembly operation.

20 Claims, 4 Drawing Sheets

FEEDER/PROGRAMMING/LOADER SYSTEM

CROSS-REFERENCE TO RELATED APPLICATION(S)

The present application contains subject matter related to U.S. patent application Ser. No. 09/418,732, now U.S. Pat. No. 6,532,395 B1, by Lev M. Bolotin entitled "MANUFACTURING SYSTEM WITH FEEDER/PROGRAMMING/BUFFER SYSTEM". The related application is assigned to Data I/O Corporation and is hereby incorporated by reference.

The present application also contains subject matter related to U.S. patent application Ser. No. 09/419,172, now U.S. Pat. No. 6,449,523 B1, by Bradley M. Johnson, Lev M. Bolotin, Simon B. Johnson, Carl W. Olson, Bryan D. Powell, and Janine Whan-Tong, entitled "FEEDER/PROGRAMMING/BUFFER OPERATING SYSTEM". The related application is assigned to Data I/O Corporation and is hereby incorporated by reference.

The present application further contains subject matter related to U.S. patent application Ser. No. 09/418,901, now U.S. Pat. No. 6,647,303 by Simon B. Johnson, George L. Anderson, Lev M. Bolotin, Bradley M. Johnson, Mark S. Knowles, Carl W. Olson, and Vincent Warhol, entitled "FEEDER/PROGRAMMING/BUFFER CONTROL SYSTEM AND CONTROL METHOD". The related application is assigned to Data I/O Corporation and is hereby incorporated by reference.

The present application still further contains subject matter related to U.S. patent application Ser. No. 09/419,162, now U.S. Pat. No. 6,591,486 by Lev M. Bolotin entitled "MANUFACTURING AND CARRIER SYSTEM WITH FEEDER/PROGRAMMING/BUFFER SYSTEM". The related application is assigned to Data I/O Corporation and is hereby incorporated by reference.

TECHNICAL FIELD

The present invention relates generally to a manufacturing system for electronic products, and more particularly to a micro device product system.

BACKGROUND ART

In the past, programmable micro devices were programmed in a large, standalone programming system, which had a programmer handling system.

For example, in the programming of programmable devices such as electrically erasable programmable read-only memories (EEPROMs) and Flash EEPROMs, separate programming equipment was used.

The programmer handling system would pick up unprogrammed micro devices, place them in the programmers for programming, and remove them for placement on a carrier. The programmer handling systems would also place rejected micro devices, which did not meet specifications or which could not be programmed, into large reject bins appropriate to large programming systems. The programmed micro devices, which were not rejected, would be placed on the carrier and placed in a feeder, which would be attached to an assembly line. The assembly line had its own assembly line handling system which would pick up the programmed micro devices and place them on printed circuit boards.

There were a number of problems with the prior art programming equipment.

First, the programming equipment was relatively large and bulky. This was because of the need to accurately insert and remove programmable devices at high speeds into and out of programming sockets in the programmer. Since insertion and removal required relatively long traverses at high speed and very precise positioning, very rigid robotic handling equipment was required. This rigidity requirement meant that the various components had to be relatively massive with strong structural support members to maintain structural integrity and precision positioning of the pick and place system moving at high speeds. Due to the size of the programming equipment and the limited space for the even larger assembly equipment, they were located in different areas.

A major problem associated with programming the programmable devices in a separate area and then bringing the programmed devices into the production assembly area to be inserted into the electronic circuit boards was that it was difficult to have two separate processes running in different areas and to coordinate between the two separate systems. Often, the production assembly line would run out of programmable devices and the entire production assembly line would have to be shut down. At other times, the programming equipment would be used to program a sufficient inventory of programmed devices to assure that the production assembly line would not be shut down; however, this increased inventory costs. Further problems were created when the programming had to be changed and there was a large inventory of programmed integrated circuits on hand. In this situation, the inventory of programmable devices would have to be reprogrammed with an accompanying waste of time and money.

Second, the programming capability of conventional programming equipment was much slower than the operating speeds of current production assembly lines. It required a number of programming systems which were generally operated for longer periods of time in order to have a reserve of programmed devices for the production assembly systems. This further took up additional, valuable floor space in a factory where space is typically at a premium.

Ideally, a micro device feeder/programming/loader system would have a small footprint, i.e., take up as little space as possible, be portable, and have much greater throughput than a conventional programmer. This ideal has been extremely difficult to achieve and has eluded those skilled in the art.

DISCLOSURE OF THE INVENTION

The present invention provides a micro device product processing system which includes a feeder/processing system. The feeder/processing system has a flexible feeder mechanism for receiving micro devices in a number of different manners, a processing mechanism for performing a processing operation on the micro devices at a high rate of speed, and a loader mechanism for receiving the processed micro devices in a number of different manners. The system substantially solves all the problems which previously faced such systems.

The present invention further provides a feeder/processing system in which a feeder mechanism for receiving micro devices, a processing mechanism for performing a processing operation on the micro devices, and a loader mechanism for receiving the processed micro devices, utilize linear operations to simplify design. The system substantially solves all the problems which previously faced such systems.

The present invention further provides a feeder/processing system in which a reduced number of components comprising a feeder mechanism for receiving micro devices, a processing mechanism for performing a processing operation on the micro devices, and a loader mechanism for receiving the processed micro devices are aligned with each other and have primarily one degree of freedom to increase speed and productivity. The system substantially solves all the problems which previously faced such systems.

The present invention further provides a feeder/processing system in which a feeder mechanism for receiving micro devices, a processing mechanism for performing a processing operation on the micro devices, and a loader mechanism for receiving the processed micro devices, utilize linear operations to simplify design. The system substantially solves all the problems which previously faced such systems.

The present invention further provides a feeder/processing system which has a flexible feeder mechanism for receiving a plurality of unprogrammed devices, a programming mechanism for performing a programming operation on the unprogrammed devices at a high rate of speed, and a loader mechanism for receiving the programmed devices. The system substantially solves all the problems which previously faced such systems.

The present invention further provides a feeder/processing system in which a feeder mechanism for receiving unprogrammed devices, a programming mechanism for performing a programming operation on the unprogrammed integrated circuits, and a loader mechanism for receiving the programmed devices, utilize linear operations to minimize system size. The system substantially solves all the problems which previously faced such systems.

The above and additional advantages of the present invention will become apparent to those skilled in the art from a reading of the following detailed description when taken in conjunction with the accompanying drawings.

BEST MODES FOR CARRYING OUT THE INVENTION

Figures 1, 2:
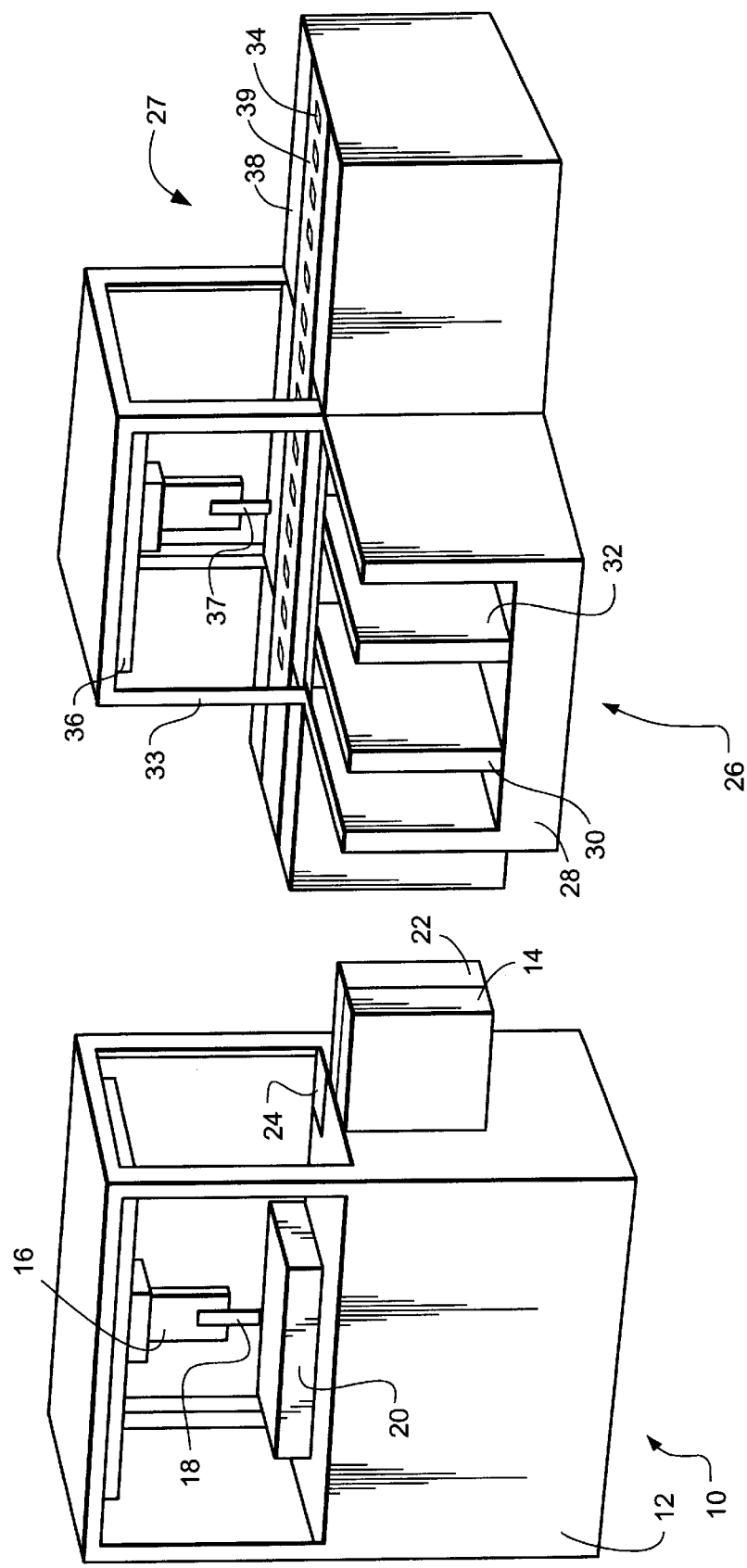
FIG. 1 (PRIOR ART) is an example of a prior art programming system.
FIG. 2 (PRIOR ART) is an example of an electronic circuit board manufacturing line of the prior art.

Referring now to FIG. 1 (PRIOR ART), therein is shown a conventional processing system, such as a programming system 10 for programmable electronic devices. The programming system 10 is used as an example. The programming system 10 is extremely large and has a rigid frame 12 to which an input mechanism 14 is attached. The input mechanism 14 can be a tray, tray stacker, tube, tube stacker, or tape and reel, which supplies unprogrammed devices to the programming system 10.

A robotics handling system 16, which is capable of moving in an X-Y-Z and θ coordinate system (with X and Y being horizontal movements, Z being vertical, and θ being angular), carries a pick-and-place (PNP) head 18 for picking up the unprogrammed devices and moving them into a programming area 20 and inserting them into programming sockets (not shown) in the programming system 10.

When the programming is complete, the robotics handling system 16 will move the PNP head 18 into place to remove the parts from the programming sockets and place them into an output mechanism 22. If the programmable devices could not be programmed, the robotics handling system 16 and the PNP head 18 will deposit the defective device into a reject bin 24.

The programming system 10 will continue to operate automatically until all the good devices in the input mechanism 14 are programmed and transferred to the output mechanism 22.

Referring now to FIG. 2 (PRIOR ART), therein is shown a production assembly system 26 which includes an assembly line 27. The production assembly system 26 includes a feeder table 28 where various feeders, such as feeders 30 and 32, are attached. Where programmed devices are involved, the output mechanism 22 from FIG. 1 (PRIOR ART) would be used as the feeders 30 and 32. In FIG. 2 (PRIOR ART), the two feeders 30 and 32 are shown installed, where each of the feeders 30 and 32 could contain different types of already programmed programmable devices. The feeders 30 and 32 can be trays, tray stackers, tubes, tube stackers, or tapes and reels with the latter being shown.

The production assembly system 26 has a support frame 33 which carries a robotics handling system 36, which is capable of carrying a PNP head 37 along an X-Y-Z-θ coordinate system to take devices from the feeders 30 and 32 and place them on printed circuit boards 34 as they are moved along a conveyor belt 39 which is mounted in an assembly line frame 38. The feeders 30 and 32 are located offset from the direction of movement of the conveyor belt 39.

Figure 3:
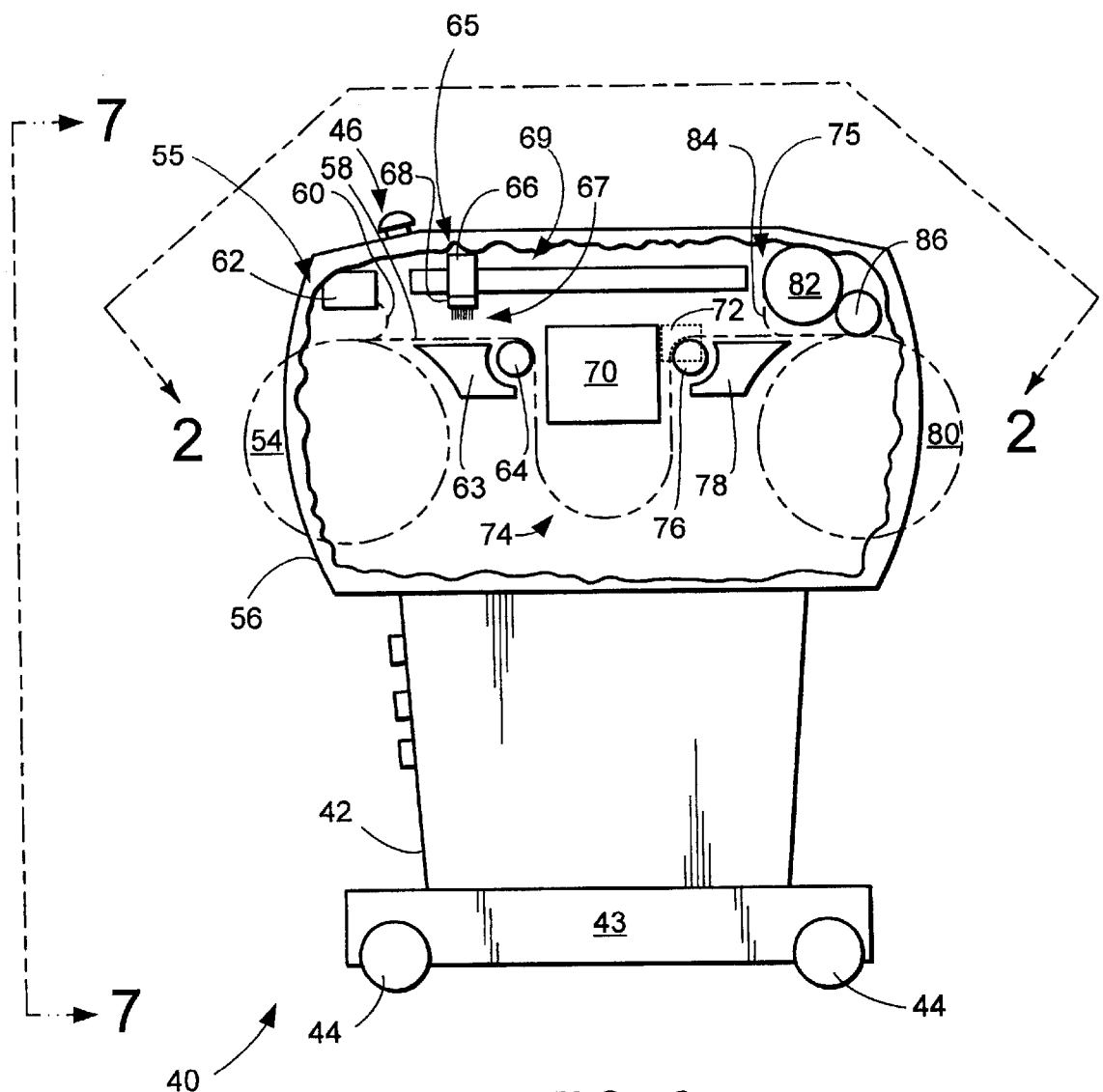
FIG. 3 is a side view of the feeder/programming/loader system of the present invention.

Referring now to FIG. 3, therein is shown one embodiment of the present invention, a feeder/programming/loader system 40, which is a linear operation system and which includes an output that fits in the same place in the production assembly system 26 of FIG. 2 (PRIOR ART) as one of the feeders 30 or 32.

The feeder/programming/loader system 40 includes a support console 42, which is mounted onto a base 43 which includes a number of wheels 44. The wheels 44 allow the feeder/programming/loader system 40 to be portable for easy movement within the production assembly area.

A number of different input and output mechanisms may be used to respectively feed and be fed from the feeder/programming/loader system 40 including tubes, tube stackers, trays, tray stacker, or tape and reels as used with prior art systems. These can be mixed and matched. Due to the in-line configuration, the feeder/programming/loader system 40 is able to flexibly accommodate different feeding and loading options with minimal changes. In the best mode, the feeder/programming/loader system 40 has an input mechanism and an output mechanism which are tape and reel feeders and loaders.

The reels could be placed in a number of different positions such as in front and at the rear as indicated respectively by an input reel 54 and an output reel 80, or underneath the feeder/programming/loader system 40 in a separate reel holder (not shown). The input reel 54 is supported by a frame 56 to allow rotation of the input reel 54 in a clockwise direction as shown in FIG. 3 by a drive mechanism (not shown) which could be a motor or a belt from another motor. Similarly, the output reel 80 is supported by the frame 56 to allow rotation of the output reel 80 in a clockwise direction as shown in FIG. 3 by a drive mechanism (not shown) which could be a motor or a belt from another motor.

The frame 56 also carries the control electronics for the feeder/programming/loader system 40 and includes a number of control buttons 46.

Using the input reel 54 as an example of a feeder mechanism 55 and the output reel 80 as an example of a loader mechanism 75, unprogrammed devices are input between a carrier tape 58 and a cover tape 60. The carrier tape 58 has a plurality of small pockets for holding unprogrammed devices, incorrectly programmed devices if reprogramming needs to be performed, or devices which were previously rejected due to corrected continuity errors which are capable of being programmed. The carrier tape 58 is roll fed from the input reel 54 across an index or tape-in mechanism 63 which includes a roller 64, an index or tape-out mechanism 78 which includes a roller 76, and onto the output reel 80.

In the first stage, the cover tape 60 will be peeled off using a peel bar (not shown) and fed to a cover tape mechanism 62, which handles disposal of the cover tape 60 by rolling it on to a spool or crushing it for later removal and disposal. The cover tape mechanism 62 applies tension to the cover tape 60 to assure that it is peeled off of the carrier tape 58. The peeling off of the cover tape 60 exposes the unprogrammed devices on the carrier tape 58.

The indexer or tape-in mechanism 63, which is part of the feeder mechanism 55, includes a motor driven sprocket (not shown), which may include the previously described belt to rotate the input reel 54, to help pull the carrier tape 58 off the input reel 54 and bring the unprogrammed devices to a handling mechanism 65 which includes a PNP head 66 in a robotics handling system 69.

To have an elegantly simple system, the feeder/programming/loader system 40 is a linear operation system, and the robotics handling system 69 needs to only provide X-axis movement back and forth along the in-line length. The PNP head 66 contains one or more individual pickup mechanisms or probes 67 which provide vertical Z-axis movement for picking up the programmable devices. This in-line linear approach greatly simplifies overall operation of the feeder/programming/loader system 40 and reduces the overall size so that it is portable and can be easily transport within a production assembly area.

To optimize throughput, the PNP head 66 has a plurality of the probes 67 to pickup a plurality of unprogrammed devices sequentially. The number of unprogrammed devices picked up at one time will be a function of the speed of the feeder/programming/loader system 40. The more unprogrammed devices programmed in a single operation, the greater the throughput, but the larger the feeder/programming/loader system 40. Multiple unprogrammed devices could be picked up simultaneously if the center-to-center spacing of the micro devices as input did not change, but in the preferred embodiment, four unprogrammed devices are picked up sequentially.

The PNP head 66 could also incorporate a marking device 68, such as a stamp or ink pen, for marking the devices to indicate production lots or feeder/programming/loader system used. As would be evident, the placement of the marking device is a matter of design.

Figure 4:
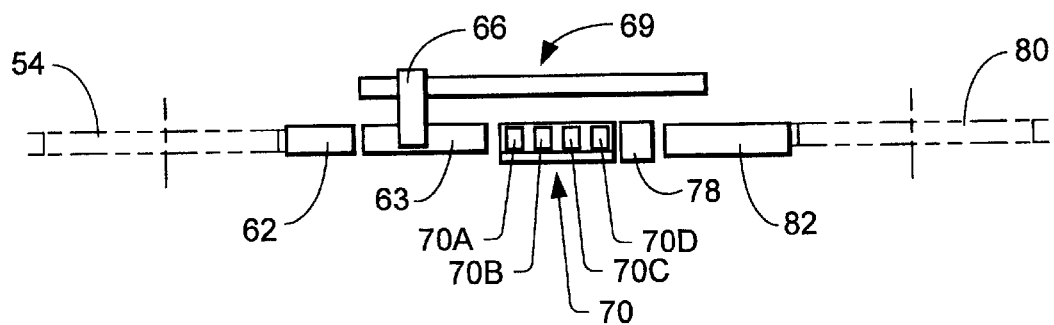
FIG. 4 is a top view of FIG. 3 taken along line 2—2.

Referring briefly to FIG. 4, therein is shown a top view of FIG. 3 along line 2—2. All the same elements as in FIG. 3 are designated by the same nomenclature and numbers as in FIG. 3. Of particular interest in FIG. 4, is a programming mechanism 70 showing four programmer socket locations 70A through 70D and the output reel 80.

Referring now back to FIG. 3, therein is shown a side view of the programming mechanism 70. After the plurality of unprogrammed devices are picked up, they are moved by the robotics handling system 69 over to the programming mechanism 70 which has a plurality of sockets 70A through 70D into which the unprogrammed devices are sequentially placed by insertion or dropping by the probes 67 of the PNP head 66. Again, if the center-to-center spacing of the micro devices did not change, a simultaneous placement could be performed.

The unprogrammed devices are then programmed by the programming mechanism 70. The simultaneous programming can be accomplished just by connecting the plurality of sockets in parallel. The sequential programming can be accomplished by connecting the plurality of sockets separately or on a series bus. This multiplies the throughput of the present invention by a factor equal to the plurality of programmable devices being programmed over the prior art programming mechanisms.

One additional feature in the programming mechanism 70 is the capability of identifying when a device cannot be programmed because it has failed processing or is "bad".

After the programming, the programmed devices may be extracted from the sockets by a number of different methods, but in the best mode, the PNP head 66 of the handling system 65 will perform sequential pickup. Again, if the center-to-center spacing of the micro devices did not change, a simultaneous extraction could be performed.

The PNP head 66 moves the bad programmable devices and deposits them in a reject bin 72. Under the programming mechanism 70 is an open area for an expanding loop 74 of the carrier tape 58 which is a compensation mechanism for missing bad programmable devices which will not be placed on the carrier tape 58 which goes on the output reel 80.

The PNP head 66 deposits the good programmed devices into the plurality of small pockets of the carrier tape 58. The indexer or tape-out mechanism 78, which is part of the loader mechanism 75, includes a motor driven sprocket (not shown), which may include the previously described belt to rotate the output reel 80, to help index the carrier tape 58 with the programmed devices towards the output reel 80.

A cover tape 84 is then dispensed from a cover tape reel 82 over the carrier tape 58 to cover the small pockets which contain the programmed devices. A securing mechanism 86 secures the cover tape 84 onto the carrier tape 58 to retain the programmed devices in the small pockets of the carrier tape 58. The securing mechanism 86 may use adhesives and/or heat to attach or seal the cover tape 84 onto the carrier tape 58. The programmed devices contained between the carrier tape 58 and the cover tape 84 are then indexed onto output reel 80 by the loader mechanism 75.

The feeder/programming/loader system 40 will continue to operate automatically until all the good devices in the input reel 54 are programmed and transferred to the output reel 80. The output reel 80 is now ready to be used in the production assembly system 26 as one of the feeders 30 or 32.

It should be noted that the programming could be performed such that the robotics handling system 69 and the PNP head 66 are in continuous operation picking and placing devices while other unprogrammed devices are being programmed by the programming mechanism 70. In the best mode, the PNP head 66 traverses to the pickup area of the tape-in mechanism 64, picks up four sequential programmable devices, sequentially places them into the sockets 70A through 70D in the programming mechanism 70, and waits until the programming is done. Then it picks up the programmable devices from the sockets 70A through 70D and places the bad devices in the reject bin 72 and the good devices on the carrier tape 58 which moves sufficiently to allow sequential placement of the programmed devices. The PNP head 66 then traverses back to the tape-in mechanism 64 to pickup four new programmable devices.

Accordingly, the present invention provides a feeder/programming/loader system that has a small footprint, is portable, and has much greater throughput than a conventional programmer, and substantially solves all the problems which previously faced such systems.

Figure 5:
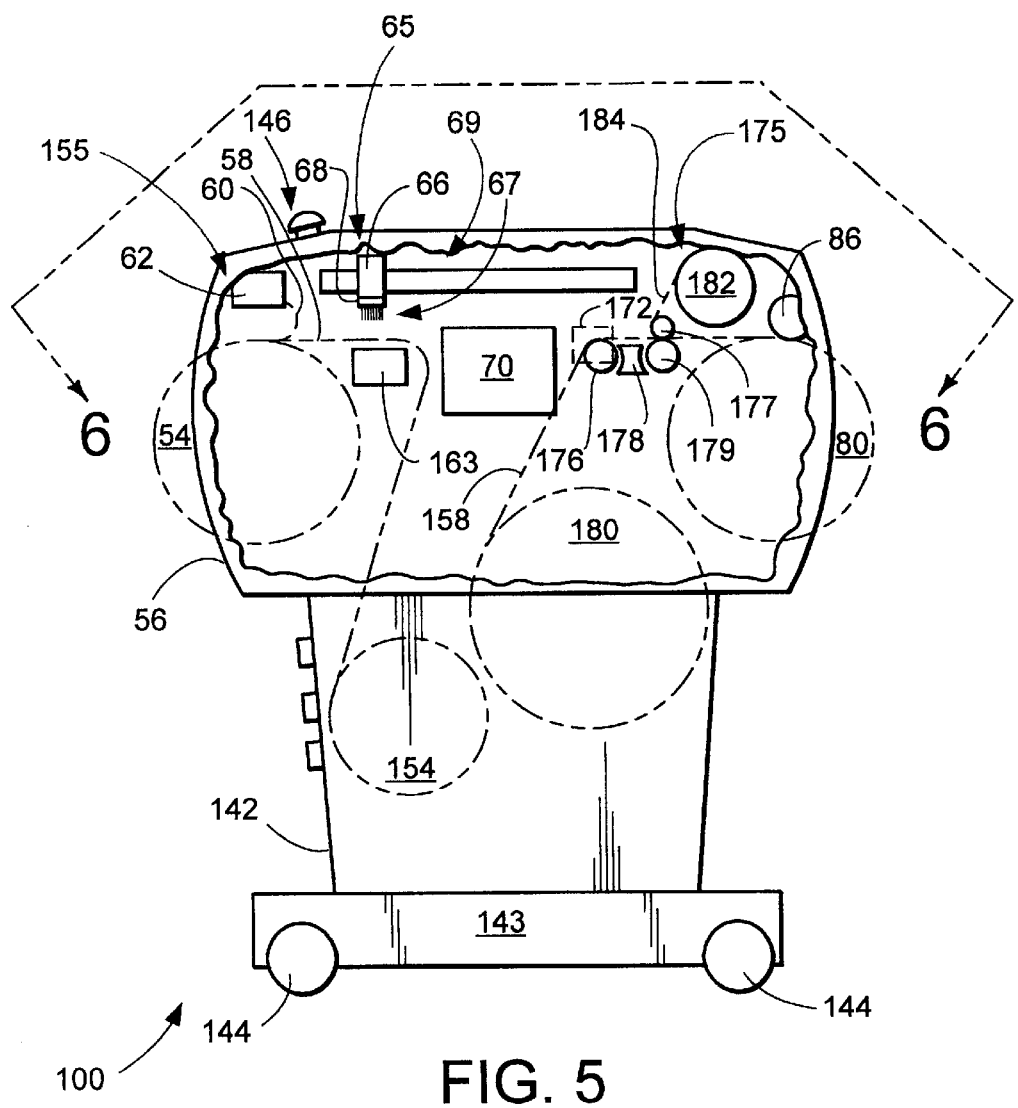
FIG. 5 is a side view of an alternative embodiment of the present invention.

Referring now to FIG. 5, therein is shown an alternate embodiment of the present invention, a feeder/programming/loader system 100 which is a linear operation system and which includes an output that fits in the same place in the production assembly system 26 of FIG. 2 (PRIOR ART) as one of the feeders 30 or 32. All the same elements as in FIG. 3 and FIG. 4 are designated by the same nomenclature and numbers as in FIG. 3 and FIG. 4.

The feeder/programming/loader system 100 includes a support console 142, which is mounted onto a base 143 which includes a number of wheels 144. The wheels 144 allow the feeder/programming/loader system 100 to be portable for easy movement within the production assembly area.

Just as for the feeder/programming/loader system 40, a number of different input and mechanisms may be used to feed and be fed by the feeder/programming/loader system 100 including tubes, tube stackers, trays, tray stackers, or tape and reels. These can be mixed and matched. Due to the in-line configuration, the feeder/programming/loader system 100 is able to flexibly accommodate different feeding and loading options with minimal changes. In the best mode, the feeder/programming/loader system 100 has a feeder mechanism and a loader mechanism which are tape and reel feeders and loaders.

The reels could be placed in a number of different positions such as in front and at the rear as indicated respectively by the input reel 54 and the output reel 80, or underneath the feeder/programming/loader system 100 (not shown). The input reel 54 is supported by the frame 56 to allow rotation of the input reel 54 in a clockwise direction as shown in FIG. 5 by a drive mechanism (not shown) which could be a motor or a belt from another motor. Similarly, the output reel 80 is supported by the frame 56 to allow rotation of the output reel 80 in a clockwise direction as shown in FIG. 5 by a drive mechanism (not shown) which could be a motor or a belt from another motor.

The frame 56 also carries the control electronics for the feeder/programming/loader system 100 and includes a number of control buttons 146.

Using the input reel 54 as an example of a feeder mechanism 155 and the output reel 80 as an example of a loader mechanism 175, unprogrammed devices are input between the carrier tape 58 and the cover tape 60. The carrier tape 58 has a plurality of small pockets for holding unprogrammed devices, incorrectly programmed devices if reprogramming needs to be performed, or devices which were previously rejected due to corrected continuity errors which are capable of being programmed. The carrier tape 58 is roll fed from the input reel 54 across an index or tape-in mechanism 164 onto a take-up reel 154 or just into a waste bin.

After the programming, the PNP head 66 deposits the good programmed devices into the plurality of small pockets of a carrier tape 158 which is supplied by a feed reel 180. The carrier tape 158 is roll fed from the feed reel 180 across an index or tape-out mechanism 178 which include rollers 176, 177 and 179 and onto the output reel 80.

In the first stage, the cover tape 60 will be peeled off using a peel bar and fed to the cover tape mechanism 62, which handles disposal of the cover tape 60 by rolling it on to a spool or crushing it for later removal and disposal. The cover tape mechanism 62 applies tension to the cover tape 60 to assure that it is peeled off of the carrier tape 58. The peeling off of the cover tape 60 exposes the unprogrammed devices on the carrier tape 58.

The tape-in mechanism 163, which is part of the feeder mechanism 155, includes a motor driven sprocket (not shown), which may include the previously described belt to rotate the input reel 54, to help pull the carrier tape 58 off the input reel 54 and bring the unprogrammed devices to the handling mechanism 65 which includes the PNP head 66 in the robotics handling system 69.

Similar to the feeder/programming/loader system 40, the feeder/programming/loader system 100 is a linear operation system, and the robotics handling system 69 needs to only provide X-axis movement back and forth along the in-line length. The operations and features of the PNP head 66 and the programming mechanism 70 are almost identical to what has been described earlier with respect to FIG. 3 and FIG. 4, except that programmed devices are deposited into a different carrier tape 158 instead of the same carrier tape 58.

Figure 6:
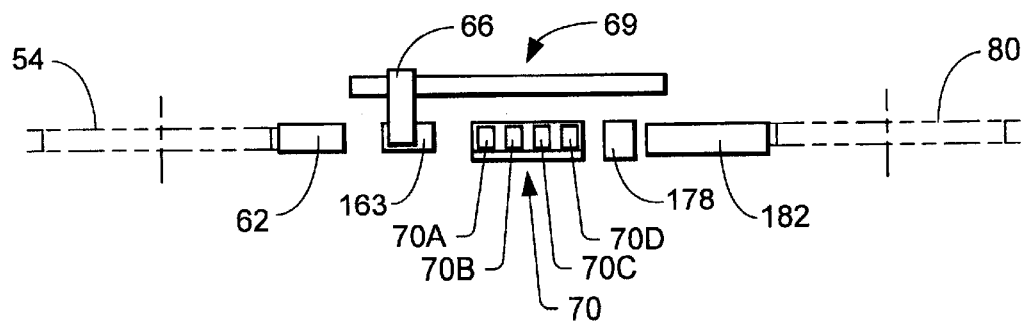
FIG. 6 is a top view of FIG. 5 taken along line 6—6.

Referring briefly to FIG. 6, therein is shown a top view of FIG. 5 along line 6—6. All the same elements as in FIG. 5 are designated by the same nomenclature and numbers as in FIG. 5. Of particular interest in FIG. 6, is the programming mechanism 70 showing four programmer socket locations 70A through 70D and the output reel 80.

After the programming, the programmed devices may be extracted from the sockets by a number of different methods, but in the best mode, the PNP head 66 of the handling system 65 will perform sequential pickup. Again, if the center-to-center spacing of the micro devices did not change, a simultaneous extraction could be performed.

The PNP head 66 moves the bad programmable devices and deposits them in a reject bin 172 and deposits the good programmed devices into the plurality of small pockets of the different carrier tape 158 which is supplied by a feed reel 180. The indexer or tape-out mechanism 178, which is part of the loader mechanism 175, includes a motor driven sprocket (not shown), which may include the previously described belt to rotate the output reel 80, to help index the carrier tape 158 towards the output reel 80.

A cover tape 184 is then dispensed from the cover tape reel 182 over the carrier tape 158 to cover the small pockets which contain the programmed devices. A pair of sprockets 177 and 179 act to register the position of the sprocket holes in the cover tape 184 and the carrier tape 158 to retain the programmed devices in the small pockets of the carrier tape 158. Again, the securing mechanism 86 may use adhesives and/or heat to attach or seal the cover tape 84 onto the carrier tape 58. The programmed devices contained between the carrier tape 58 and the cover tape 84 are then indexed onto the output reel 80 by the loader mechanism 175.

The feeder/programming/loader system 100 will continue to operate automatically until all the good devices in the input reel 54 are programmed and transferred to the output reel 80. The output reel 80 is now ready to be used in the production assembly system 26 as one of the feeders 30 or 32.

Figure 7:
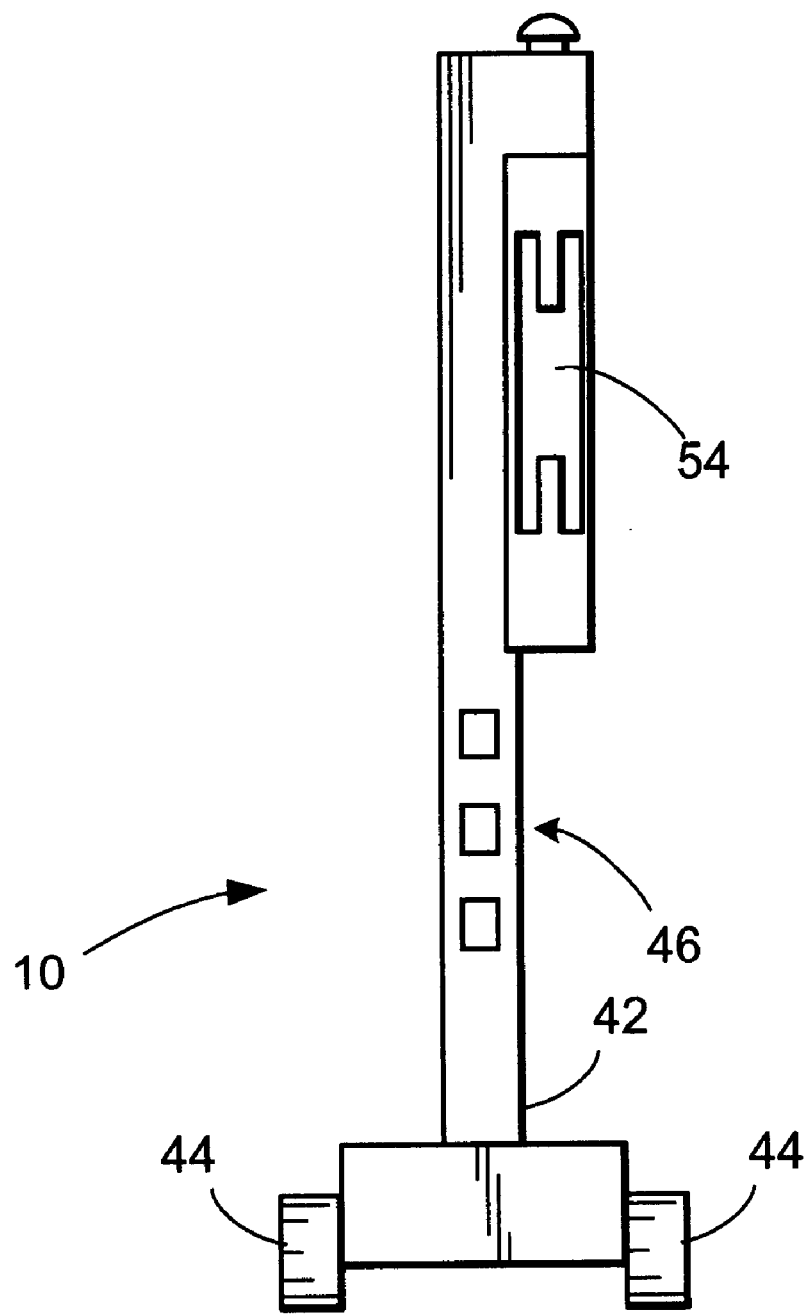
FIG. 7 is a side view of FIG. 3 taken along line 7—7.

Referring now to FIG. 7, therein is shown a side view of FIG. 3 along line 7—7. All the same elements as in FIG. 3 are designated by the same nomenclature and numbers as in FIG. 3. Of particular interest in FIG. 7 is the small overall footprint of the feeder/programming/loader system 40 which also allows it to be portable within a production assembly area.

Accordingly, the present invention provides a feeder/programming/loader system that has a small footprint, is portable, and has much greater throughput than a conventional programmer, and substantially solves all the problems which previously faced such systems. As will be evident to those skilled in the art, multiple feeder/programming/loader systems could be placed side by side on a single frame. The feeder/programming/loader systems 40 and 100 further may be described in the best modes as tape-to-tape machines.

From the above it will be understood that the present invention is applicable to what can be described as "micro devices". Micro devices include a broad range of electronic and mechanical devices. The best mode describes processing which is programming for programmable devices, which include but are not limited to devices such as Flash memories (Flash), electrically erasable programmable read only memories ($E^2$PROM), programmable logic devices (PLDs), field programmable gate arrays (FPGAs), and microcontrollers. However, the present invention encompasses processing for all electronic, mechanical, hybrid, and other devices which require testing, measurement of device characteristics, calibration, and other processing operations. For example, these types of micro devices would include but not be limited to devices such as microprocessors, integrated circuits (ICs), application specific integrated circuits (ASICs), micro mechanical machines, micro-electro-mechanical (MEMs) devices, micro modules, and fluidic systems.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A micro device product processing system comprising:
    a feeder mechanism capable of providing an unprocessed micro device;
    a processing mechanism capable of receiving the unprocessed micro device from the feeder mechanism and processing the micro device to produce a processed micro device;
    a loader mechanism capable of receiving the processed micro device from the processing mechanism; and
    a handling mechanism capable of moving micro devices among the feeder, processing, and loader mechanisms only in linear horizontal and vertical directions.

2. The micro device product processing system as claimed in claim 1 wherein:
    the feeder, processing, and loader mechanisms are in line.

3. The micro device product processing system as claimed in claim 1 wherein:
    the handling mechanism includes a robotic handling system for moving micro devices in a horizontal linear direction and a pick-and-place mechanism for moving micro devices in a vertical direction.

4. The micro device product processing system as claimed in claim 3 wherein:
    the pick-and-place mechanism includes a marking mechanism capable of marking micro devices.

5. The micro device product processing system as claimed in claim 1 wherein:
    the feeder mechanism is capable of providing an unprocessed micro device in a feeder selected from a group consisting of a tray, tray stacker, tube, tube stacker, and tape and reel.

6. The micro device product processing system as claimed in claim 1 wherein:
    the loader mechanism is capable of receiving a processed micro device in a loader selected from a group consisting of a tray, tray stacker, tube, tube stacker, and tape and reel.

7. The micro device product processing system as claimed in claim 1 wherein:
    the processing mechanism processes the micro device with a process selected from a group consisting of programming, calibration, test, and measurement.

8. The micro device product processing system as claimed in claim 1 wherein:
    the processing mechanism processes a plurality of micro devices.

9. The micro device product processing system as claimed in claim 1 wherein:
    the processing mechanism includes a mechanism for detecting and rejecting failed micro devices after processing.

10. A micro device product processing system comprising:
    a feeder mechanism capable of providing an unprocessed micro device;
    a processing mechanism capable of receiving the unprocessed micro device from the feeder mechanism and processing the micro device to produce a processed micro device;
    a loader mechanism capable of receiving the processed micro device from the processing mechanism, wherein the feeder, processing, and loader mechanisms are in line; and
    a handling mechanism capable of moving micro devices among the feeder, processing, and loader mechanisms in a linear direction, the handling mechanism includes a robotic handling system for moving micro devices only in a horizontal linear direction and a pick-and-place mechanism for moving micro devices only in a vertical direction.

11. The micro device product processing system as claimed in claim 10 wherein:
    the pick-and-place mechanism includes a marking mechanism capable of marking micro devices.

12. The micro device product processing system as claimed in claim 10 wherein:
    the feeder mechanism is capable of providing an unprocessed micro device in a feeder selected from a group consisting of a tray, tray stacker, tube, tube stacker, and tape and reel.

13. The micro device product processing system as claimed in claim 10 wherein:
    the loader mechanism is capable of receiving a processed micro device in a loader selected from a group consisting of a tray, tray stacker, tube, tube stacker, and tape and reel.

14. The micro device product processing system as claimed in claim 10 wherein:

the processing mechanism processes the micro device with a process selected from a group consisting of programming, calibration, test, and measurement.

15. The micro device product processing system as claimed in claim 10 wherein:

the processing mechanism processes a plurality of micro devices.

16. The micro device product processing system as claimed in claim 10 wherein:

the processing mechanism includes a mechanism for detecting and rejecting failed micro devices after processing; and the processing mechanism includes a compensation mechanism for compensating for failed micro devices not being provided to the loader mechanism.

17. A feeder/processing system comprising:

a feeder mechanism capable of providing an unprocessed micro device in a feeder selected from a group consisting of a tray, tray stacker, tube, tube stacker, and tape and reel;

a processing mechanism capable of receiving the unprocessed micro device from the feeder mechanism and processing the micro device to produce a processed micro device, wherein the processing mechanism processes the micro device with a process selected from a group consisting of programming, calibration, test, and measurement;

a loader mechanism capable of receiving the processed micro device from the processing mechanism in a loader selected from a group consisting of a tray, tray stacker, tube, tube stacker, and tape and reel, wherein the feeder, processing, and loader mechanisms are in line; and a handling mechanism capable of moving micro devices among the feeder, processing, and loader mechanisms in a linear direction, the handling mechanism includes a robotic handling system for moving micro devices only in a horizontal linear direction and a pick-and-place mechanism for moving micro devices only in a vertical direction.

18. The micro device product processing system as claimed in claim 17 wherein:

the pick-and-place mechanism includes a marking mechanism capable of marking micro devices.

19. The micro device product processing system as claimed in claim 17 wherein:

the processing mechanism processes a plurality of micro devices.

20. The micro device product processing system as claimed in claim 17 wherein:

the processing mechanism includes a mechanism for detecting and rejecting failed micro devices after processing;

the processing mechanism includes an expanding compensation mechanism for compensating for failed micro devices not being provided from the feeder mechanism to the loader mechanism.

* * * * *